United States Patent
Kayatani et al.

(10) Patent No.: US 6,614,641 B2
(45) Date of Patent: Sep. 2, 2003

(54) CERAMIC ELECTRONIC COMPONENT

(75) Inventors: Takayuki Kayatani, Shiga-ken (JP); Hidekiyo Takaoka, Kusatsu (JP); Kunihiko Hamada, Kyoto (JP)

(73) Assignee: Murata Manufacturing Co., Ltd (JP)

( * ) Notice: Subject to any disclaimer, the term of this patent is extended or adjusted under 35 U.S.C. 154(b) by 0 days.

(21) Appl. No.: 10/117,276

(22) Filed: Apr. 8, 2002

(65) Prior Publication Data

US 2003/0037962 A1 Feb. 27, 2003

(30) Foreign Application Priority Data

Apr. 10, 2001 (JP) .................................. 2001-111328
Jan. 24, 2002 (JP) .................................. 2002-015470

(51) Int. Cl.[7] ............................................... H01G 4/12
(52) U.S. Cl. .................................. 361/305; 361/306.1
(58) Field of Search ........................ 361/301.4, 303, 361/304, 305, 306.1, 306.3, 308.1, 308.2, 308.3, 309, 311, 312, 313, 320, 321.1–321.5; 338/309, 327, 328, 332; 257/692, 700, 703

(56) References Cited

U.S. PATENT DOCUMENTS 4,130,854 A * 12/1978 Hertz .......................... 361/304
6,043,973 A *  3/2000 Nagashima et al. ......... 361/305
6,195,248 B1 *  2/2001 Kunishi et al. .............. 361/305

* cited by examiner

*Primary Examiner*—Anthony Dinkins
*Assistant Examiner*—Eric Thomas
(74) *Attorney, Agent, or Firm*—Dickstein, Shapiro, Morin & Oshinsky, LLP.

(57) ABSTRACT

A ceramic electronic component includes a ceramic body; terminal electrodes formed on the ceramic body; and lead terminals joined to the terminal electrodes with solder containing Sn. Each terminal electrode includes a first electrode layer formed on the ceramic body and a second electrode layer formed on the first electrode layer. The second electrode layer contains a conductive constituent containing at least Zn, Ag and/or Cu, and Sn. The Zn content in the second electrode layer is about 4% by weight or more in relation to 100% by weight of the conductive constituent and is within the solubility limit not forming AgZn and/or CuZn intermetallic compounds.

19 Claims, 2 Drawing Sheets

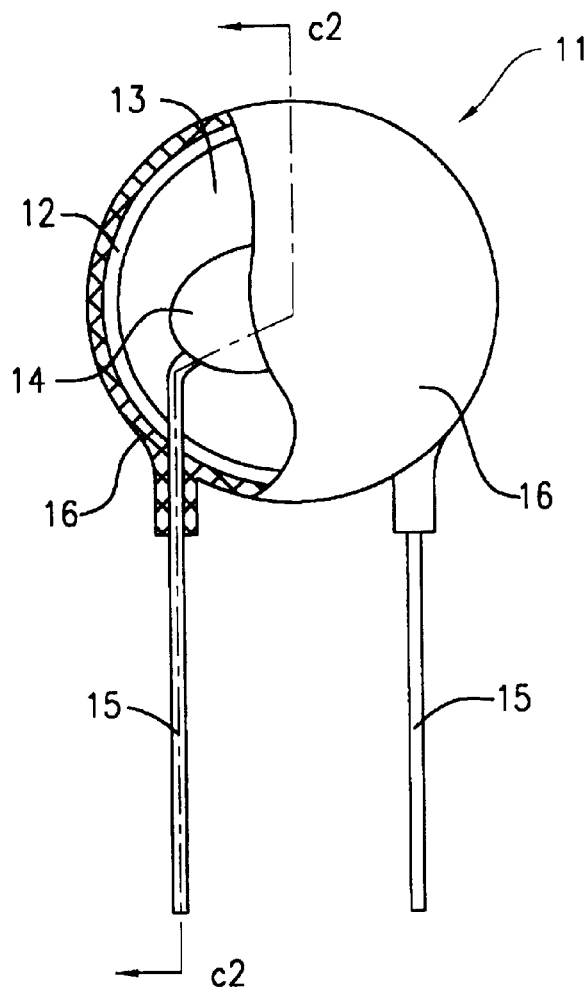 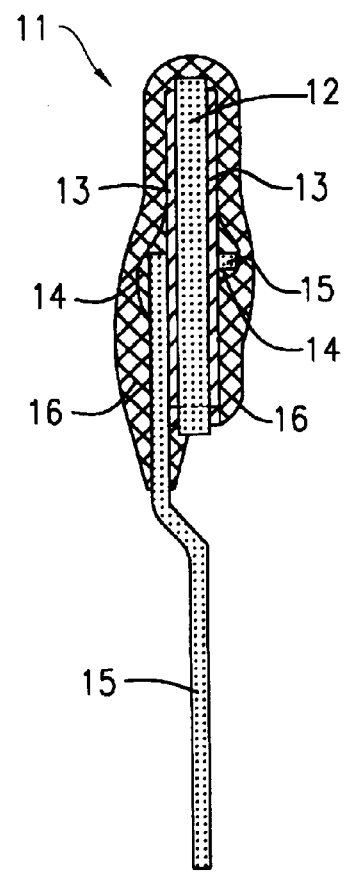
(PRIOR ART)
FIG. 1A
(PRIOR ART)
FIG. 1B

CERAMIC ELECTRONIC COMPONENT

BACKGROUND OF THE INVENTION

1. Field of the Invention

The present invention relates to ceramic electronic components, and, more particularly, to a ceramic electronic component including a ceramic body, two-layered terminal electrodes, lead terminals and solder.

2. Description of the Related Art

A conventional ceramic electronic component of such a type will be described with reference to FIGS. 1A and 1B. As shown in the drawing, a ceramic electronic component 11 includes a ceramic body 12 mainly composed of a dielectric material, insulator, semiconductor, piezoelectric material, magnetic material or the like; terminal electrodes 13 formed on both principal surfaces of the ceramic body 12; lead terminals 15 joined to the corresponding terminal electrodes 13 with solder 14; and an outer resin section 16 which is formed so as to cover the ceramic body 12, the terminal electrodes 13, the solder 14 and parts of the lead terminals 15.

The terminal electrodes 13 include thin films or thick films formed by sputtering or vapor deposition and plating films containing, for example, a noble metal, such as Ag or Pd, or an alloy thereof, or a base metal, such as Ni or Cu, or an alloy thereof, as a conductive constituent. As the solder 14, an alloy containing Sn/Pb as a principal constituent is commonly used. The lead terminal 15, for example, includes a core composed of Cu, Fe or the like, which is coated by Sn-Pb or Sn plating.

However, when the ceramic electronic component in accordance with the conventional technique is exposed to a high temperature environment for a long period of time, intermetallic compounds are formed at the joint interfaces between the terminal electrode and the solder and between the terminal electrode and the ceramic body due to interdiffusion between Sn contained in the solder and the conductive constituent of the terminal electrode mainly composed of Ag, Cu, Ni or the like. Since the intermetallic compound is rigid and brittle, bonding reliability is decreased and separation occurs between the ceramic body and the terminal electrode when the entire terminal electrode is transformed into the intermetallic compound, resulting in degradation in electrical characteristics.

When Sn/Pb solder is used, a Pb-rich phase is generated at the interface between the intermetallic compound and the solder due to the diffusion of Sn. If the ceramic electronic component has a structure in which the soft Pb-rich phase and the rigid, brittle intermetallic compound are brought into contact with each other, cracking occurs in the terminal electrode, etc., when stress is applied, resulting in degradation in bonding reliability.

SUMMARY OF THE INVENTION

It is an object of the present invention to provide a ceramic electronic component in which stable electrical characteristics are ensured even if exposed to a high temperature environment for a long period of time and which has satisfactory bonding strength between the ceramic body and terminal electrodes and between the terminal electrodes and lead terminals.

In one aspect of the present invention, a ceramic electronic component includes a ceramic body, terminal electrodes formed on the ceramic body, and lead terminals joined to the terminal electrodes with solder containing Sn. Each terminal electrode includes a first electrode layer formed on the ceramic body and a second electrode layer formed on the first electrode layer, and the second electrode layer contains a conductive constituent containing at least Zn, Ag and/or Cu, and Sn. The Zn content in the second electrode layer is about 4% by weight or more in relation to 100% by weight of the conductive constituent, and is within the solubility limit so that it does not form AgZn and/or CuZn intermetallic compounds.

In the ceramic electronic component in which the lead terminal is joined to the second electrode layer with the solder, AgZn and/or CuZn intermetallic compounds must be prevented from being formed after soldering in order to achieve the object of the present invention. Incidentally, the solubility limit for not forming AgZn and/or CuZn intermetallic compounds are not determined by the Zn content directly and exclusively. It is determined by the cooling rate from the molten state to the solid state and the solid-state temperature after cooling. In particular, when soldering is performed as in the case of the present invention, since the cooling rate is fast, the nonequilibrium state is brought about, and it is not possible to numerically express the solubility limit using the Zn content. Therefore, the Zn content is defined as being within the solubility limit which does not form AgZn and/or CuZn intermetallic compounds.

In another aspect of the present invention, a ceramic electronic component includes a ceramic body, terminal electrodes formed on the ceramic body, and lead terminals joined to the terminal electrodes with solder containing Sn. Each terminal electrode includes a first electrode layer formed on the ceramic body and a second electrode layer formed on the first electrode layer, and a barrier layer is formed in the first electrode layer and/or the second electrode layer due to the flow and concentration of Zn in the second electrode layer.

Preferably, the barrier layer lies in the first electrode layer and is formed within a range of about 2 $\mu$m from the interface with the ceramic body.

Preferably, the first electrode layer is composed of a thin film or a thick film and contains a conductive constituent containing at least Ag and/or Cu.

Preferably, the lead terminals are coated with an alloy which does not contain Pb apart from incidental impurities or a metal other than Pb, and the solder does not contain Pb apart from incidental impurities.

Preferably, the second electrode layer is formed by hot dipping.

A ceramic electronic component of the present invention includes two-layered terminal electrodes, each including a first electrode layer formed on a ceramic body and a second electrode layer formed on the first electrode layer. The second electrode layer contains a conductive constituent containing at least Zn, Ag and/or Cu, and Sn.

When the ceramic electronic component is subjected to thermal aging after the second electrode layer is provided on the ceramic electronic component, Zn in the second electrode layer is concentrated in the vicinity of the interface with the first electrode layer to form a barrier layer. The barrier layer flows into the first electrode layer as thermal aging advances, and then reaches the vicinity of the interface between the first electrode layer and the ceramic body. Since the barrier layer suppresses interdiffusion between Sn contained in the solder formed on the second electrode layer and the parent metal in the first electrode layer, intermetallic compounds are inhibited from being formed at the interface between the second electrode layer and the solder and at the interface between the ceramic body and the first electrode layer, and thus separation between the terminal electrode and the solder and separation between the ceramic body and the terminal electrode are prevented. Therefore, stable electrical characteristics are ensured even if exposed to a high temperature environment for a long period of time and satisfactory bonding strength is obtained between the ceramic body and the terminal electrodes and between the terminal electrodes and the lead terminals. Additionally, the barrier layer is not necessarily required to be formed in the entire region or to the same level in the second electrode layer or the first electrode layer, and the barrier layer may be formed substantially as a film of varying thickness so that interdiffusion with the parent metal in the first electrode layer is inhibited.

The Zn content in the second electrode layer must be about 4% by weight or more in relation to 100% by weight of the conductive constituent constituting the second electrode layer, and must be within the solubility limit not forming AgZn and/or CuZn intermetallic compounds. If the Zn content is about 4% by weight or more, a barrier layer is formed in the second electrode layer or the first electrode layer, and interdiffusion between Sn in the solder and the parent metal in the first electrode layer is inhibited. That is, intermetallic compounds are inhibited from being formed at the interface between the second electrode layer and the solder and at the interface between the ceramic body and the first electrode layer, resulting in an improvement in bonding reliability between the ceramic body and the terminal electrode and between the terminal electrode and the solder. If the Zn content is within the solubility limit in which brittle AgZn and/or CuZn intermetallic compounds in the $\beta$, $\gamma$, and $\epsilon$ phases shown in Hansen's binary phase diagram are not formed, bonding reliability between the ceramic body and the terminal electrode and between the terminal electrode and the solder is maintained since intermetallic compounds are inhibited from being formed at the interface between the second electrode layer and the solder and at the interface between the ceramic body and the first electrode layer. Therefore, stable electrical characteristics are ensured even if exposed to a high temperature environment for a long period of time and satisfactory bonding strength is obtained between the ceramic body and the terminal electrodes and between the terminal electrodes and the lead terminals. In general, since Zn is a base metal, it is easily subjected to electrolytic etching, resulting in a decrease in the mechanical strength of the terminal electrode. However, if the Zn content is within the ranges described above, such a problem is not encountered.

The barrier layer preferably lies in the first electrode layer and is formed within a range of about 2 $\mu$m from the interface with the ceramic body. As described above, the concentrated Zn in the second electrode layer flows into the first electrode layer as thermal aging advances and then reaches the vicinity of the interface between the first electrode layer and the ceramic body. However, it does not easily diffuse into the ceramic body. Therefore, if the barrier layer formed due to the concentration of Zn lies in the first electrode layer and in the vicinity of the interface with the ceramic body, Zn which flows therein as thermal aging advances accumulates. In such a case, a barrier layer formed within about 2 $\mu$m from the interface with the ceramic body has the most uniform thickness, which is advantageous.

The lead terminals are preferably coated with an alloy which does not contain Pb apart from incidental impurities or a metal other than Pb, and the solder preferably does not contain Pb apart from incidental impurities. If Pb is not present in the lead terminals and the solder, a Pb-rich phase is not easily produced even if Sn in the solder is diffused, and therefore, even if stress is applied to the terminal electrodes, cracking does not easily occur, resulting in an increase in bonding reliability.

BRIEF DESCRIPTION OF THE DRAWINGS

FIG. 1A is a partial sectional view of a conventional ceramic electronic component and FIG. 1B is a longitudinal sectional view taken along the line c2—c2 of FIG. 1A.

DESCRIPTION OF THE PREFERRED EMBODIMENT

Figure 2A:
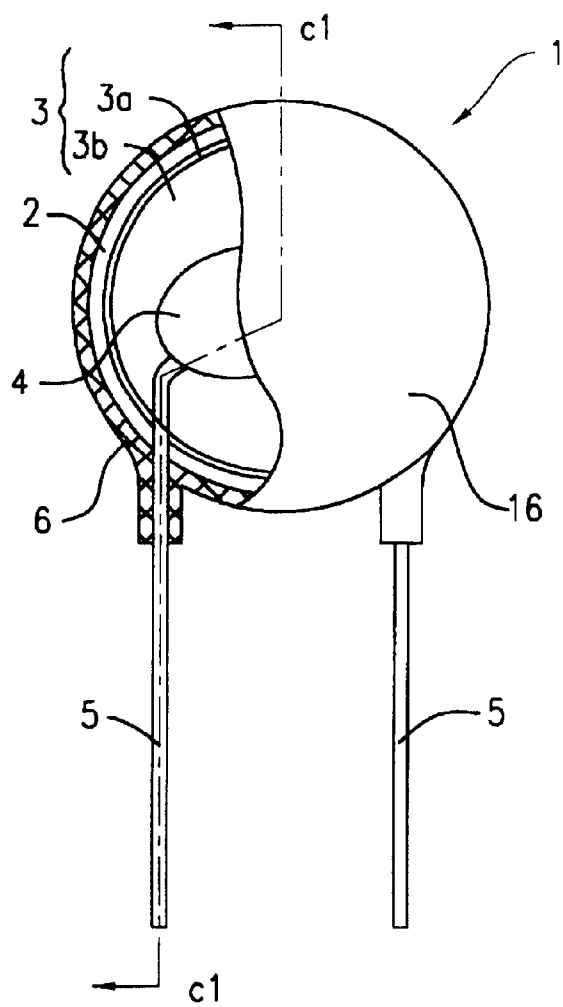
FIG. 2A is a partial sectional view of a ceramic electronic component in an embodiment of the present invention and FIG. 2B is a longitudinal sectional view taken along the line c1—c1 of FIG. 2A.
Figure 2B:
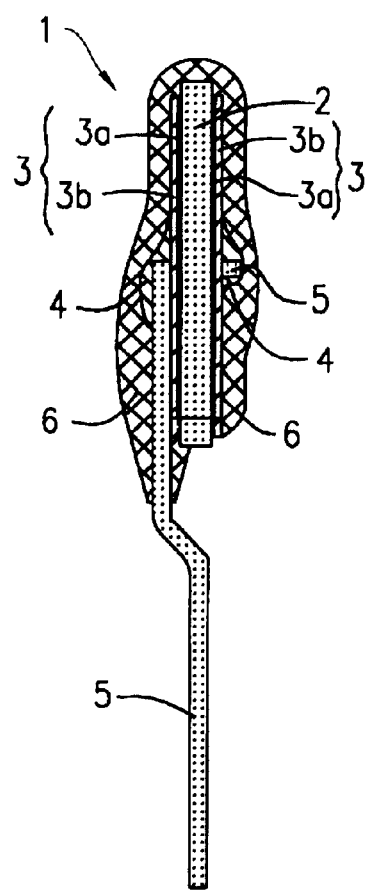

A ceramic electronic component in an embodiment of the present invention will be described with reference to FIGS. 2A and 2B. As shown in the drawing, a ceramic electronic component 1 includes a ceramic body 2, terminal electrodes 3, solder sections 4, lead terminals 5 and an outer resin section 6. Each terminal electrode 3 includes a first electrode layer 3a and a second electrode layer 3b.

The ceramic body 2 is composed of a disc-shaped sintered compact obtained by firing a ceramic green sheet. The first electrode layers 3a are formed on both principal surfaces of the ceramic body 2. The second electrode layers 3b are formed on the first electrode layers 3a.

The solder sections 4 are formed on the terminal electrodes 3 so as to bond the second electrode layers 3b and the lead terminals 5 to each other. The outer resin section 6 is formed so as to cover the ceramic body 2, the terminal electrodes 2, the solder sections 4 and parts of the lead terminals 5.

The ceramic body 2 may be appropriately composed of a material selected from the group consisting of dielectric materials, insulators, semiconductors, piezoelectric materials and magnetic materials. Additionally, although the ceramic body 2 shown in FIG. 2A is a disc, the shape of the ceramic body 2 is not limited thereto, and for example, a rectangular ceramic body may be used as long as it has areas sufficient for forming the terminal electrodes 3.

The first electrode layers 3a formed on both principal surfaces of the ceramic body 2 may be electrode films which contain a conductive constituent containing, for example, Ag and/or Cu, and which are composed of thin films formed by sputtering or vapor deposition, and electrolytic/electroless plating or thick films formed by printing of a conductive paste. The shape and size of the first electrode layer 3a is not limited to the embodiment of the present invention, and for example, first electrode layers may be formed over the entire principal surfaces of the ceramic body 2 or may be formed so as to have a gap width in a predetermined shape. In either case, the effects of the present invention can be obtained. The number of layers constituting the first electrode layer 3a is not limited to one as seen in the embodiment of the present invention, and the first electrode layer may be composed of a plurality of sublayers.

The second electrode layers 3b contain a conductive constituent containing at least Zn, Ag and/or Cu, and Sn, and may be composed of thin films formed on the first electrode layers 3a by sputtering, hot dipping or the like. The shape and size of the second electrode layer 3b is not limited to the embodiment of the present invention, and for example, second electrode layers may be formed over the entire surfaces of the first electrode layers 3a or may be formed so as to have a gap width in a predetermined shape. In either case, the effects of the present invention can be obtained. The number of layers constituting the second electrode layer 3b is not limited to one as seen in the embodiment of the present invention, and the second electrode layer may be composed of a plurality of sublayers.

For the solder sections 4, although the common Sn-based solder may be used, a solder not containing Pb, which is an environmentally unfriendly substance, apart from incidental impurities is preferably used. For example, typical Sn—Ag-based solders, Sn—Cu-based solders, Sn—Ag—Cu-based solders and Sn—Sb-based solders may be appropriately used. The shape and size of the solder section 4 are not limited to the embodiment of the present invention, and for example, the solder section 4 may be formed over the entire surface of the second electrode layer 3b or over a predetermined part of the second electrode layer 3b. As the soldering method, for example, dip soldering or reflow soldering may be performed.

As the lead terminals 5, although any known lead terminals may be appropriately used although, preferably, the lead terminals 5 do not contain Pb, which is an environmentally unfriendly substance, apart from incidental impurities. For example, a metal wire composed of Cu, Fe, Ni, Au, or the like may be used as a core of the lead terminal, and as necessary, plating is performed on the surface of the metal wire using Sn, Cu, Pd, Au, Sn—Cu, Sn—Ag, Sn—Ag—Cu or the like. Additionally, the number of lead terminals 5 joined to the second electrode layer 3b is not limited to the embodiment of the present invention, and two or more lead terminals 5 may be joined to the second electrode layer 3b.

Although the outer resin section 6 may be composed of an epoxy resin, a silicone resin or the like, the present invention is not limited thereto, and any resin may be appropriately used as long as it has superior insulating properties, moisture resistance, impact resistance, heat resistance, etc. The outer resin section 6 is not limited to the embodiment of the present invention, or may not be necessarily required, and the outer resin section 6 may have any number of layers.

EXAMPLES

Ceramic capacitors were formed as examples of the ceramic electronic component of the present invention. First, a plurality of disk shaped ceramic bodies with a diameter of 8 mm, containing barium titanate as a principal constituent and which function as the capacitors dielectric, were prepared. First electrode layers were formed over the principal surfaces of each ceramic body at a thickness of approximately 5 $\mu$m, with a gap of 1 mm around the disk circumference (i.e., the layer was 6 mm in diameter), with the layer structure and composition shown in Table 1 below. That is, pairs of first electrode layers composed of Ag thick films, Cu thick films, Monel/Cu sputtered films and electroless Cu plating films were formed.

Next, second electrode layers with a thickness of approximately 2 $\mu$m were formed over the entire surfaces of the first electrode layers of each capacitor by Sn—Ag—Zn hot dipping, Sn—Cu—Zn hot dipping, Sn—Ag hot dipping or Sn—Cu hot dipping, depending on the composition of the first electrode layers. The Zn content in relation to 100% by weight of the conductive constituent constituting the second electrode layer is shown in Table 1. The Zn content was measured based on the content determined by an energy-dispersive X-ray micro-analyzer (EDX).

Next, lead terminals including Cu as cores on which Sn plating was performed and solders having the compositions shown in Table 1 were prepared. The lead terminals are soldered to the second electrode layers at the liquid phase temperature +30° C. for each solder. Ceramic capacitors of Examples 1 to 15 and Comparative Examples of 1 to 9 were thereby obtained.

TABLE 1

| Sample | First Electrode Layer Composition/ Structure | Second Electrode Layer Composition/ Structure | Zn Content (Wt %) | Lead Terminal Composition | Solder Composition |
|---|---|---|---|---|---|
| Example | | | | | |
| 1 | Ag | Sn—Ag—Zn | 4.1 | Sn—Cu | Sn-40Pb |
| 2 | Thick | hot | 5.7 | | Sn-3.5Ag |
| 3 | Film | Dipping | 7.6 | | Sn-3.5Ag-0.7Cu |
| 4 | | | 11.5 | | Sn-3.5Ag |
| 5 | | | 12.2 | | Sn-3.5Ag-0.7Cu |
| 6 | | | 18.2 | | Sn-3.5Ag |
| 7 | Cu thick film | Sn—Cu—Zn | 5.3 | | Sn-0.7Cu |
| 8 | | Hot | 8.2 | | |
| 9 | | Dipping | 18.4 | | Sn-3.5Ag-0.7Cu |
| 10 | Monel/Cu | | 7.8 | | Sn-0.7Cu |
| 11 | thin film | | 10.4 | | |
| 12 | | | 13.3 | | Sn-3.5Ag-0.7Cu |
| 13 | Electroless | | 4.5 | | Sn-0.7Cu |
| 14 | Cu plating | | 10.9 | | |

TABLE 1-continued

| Sample | First Electrode Layer Composition/ Structure | Second Electrode Layer Composition/ Structure | Zn Content (Wt %) | Lead Terminal Composition | Solder Composition |
|---|---|---|---|---|---|
| 15 | | | 17.5 | | Sn-3.5Ag-0.7Cu |
| Comparative Example | | | | | |
| 1 | Ag thick film | Sn—Ag | — | Sn—Cu | Sn-40Pb |
| 2 | | Hot dipping | | | Sn-3.5Ag |
| 3 | | Sn—Ag—Zn | 1.2 | | Sn-3.5Ag |
| 4 | | Hot dipping | 35.7 | | |
| 5 | Cu thick film | Sn—Cu hot dipping | — | | Sn-0.7Cu |
| 6 | | Sn—Cu—Zn | 1.6 | | |
| 7 | Monel/Cu thin film | hot Dipping | 2.1 | | |
| 8 | | Electroless | 1.8 | | |
| 9 | | Cu plating | 42.4 | | |

With respect to the ceramic capacitors of Examples 1 to 15 and Comparative Examples 1 to 9, cross-sectional observation was performed to check if AgZn and/or CuZn intermetallic compounds were formed in the second electrode layers and if barrier layers in which Zn was concentrated were formed. The results thereof are shown in Table 2. With respect to 10 test pieces for each sample, the initial bonding strength of the lead terminals was measured, and after the test pieces were left in air at a high temperature of 125° C. for 2,000 hours, the bonding strength of the lead terminals was measured again. The average values were calculated and the decreasing rate of bonding strength was then calculated. The results thereof are also shown in Table 2.

The formation of the barrier layers was confirmed by analyzing the distribution of Zn in the cross section using a wavelength dispersive X-ray micro-analyzer (WDX).

In order to measure the bonding strength of the lead terminals, a pair of lead terminals for the sample were pulled away from each other, and the maximum strength at which the lead terminal was separated from the terminal electrode or the terminal electrode was separated from the ceramic body was measured. In order to determine the decreasing rate of bonding strength, a difference between the measurement result after being left at the high temperature and the initial measurement result was divided by the measurement result after being left at the high temperature.

TABLE 2

| | Second Electrode Layer AgZn, CuZn Intermetallic compound | First/ Second Electrode Layers Barrier Layer with concentrated Zn | Lead Terminal | | |
|---|---|---|---|---|---|
| | | | Initial Bonding strength (N) | After being left at high temperature (2,000 hours) | |
| Sample | | | | Bonding strength (N) | Decreasing rate of bonding strength (%) |
| Example | | | | | |
| 1 | Not formed | Formed | 39.2 | 33.3 | −15 |
| 2 | | | 40.8 | 33.5 | −18 |
| 3 | | | 39.9 | 33.9 | −15 |
| 4 | | | 41.5 | 36.1 | −13 |
| 5 | | | 42.2 | 35.4 | −16 |
| 6 | | | 39.7 | 34.9 | −12 |
| 7 | | | 36.7 | 30.5 | −17 |
| 8 | | | 35.3 | 29.7 | −16 |
| 9 | | | 35.8 | 29.4 | −18 |
| 10 | | | 31.2 | 25.0 | −20 |
| 11 | | | 29.9 | 24.5 | −18 |
| 12 | | | 28.4 | 23.0 | −19 |
| 13 | | | 24.1 | 20.5 | −15 |
| 14 | | | 23.5 | 19.7 | −16 |
| 15 | | | 24.8 | 20.8 | −16 |

TABLE 2-continued

| | Second Electrode | First/Second Electrode Layers | Lead Terminal | | |
|---|---|---|---|---|---|
| | | | Initial Bonding strength (N) | After being left at high temperature (2,000 hours) | |
| Sample | Layer AgZn, CuZn Intermetallic compound | Barrier Layer with concentrated Zn | | Bonding strength (N) | Decreasing rate of bonding strength (%) |
| Comparative Example | | | | | |
| 1 | | Not formed | 38.5 | 5.0 | −87 |
| 2 | | | 39.2 | 7.8 | −80 |
| 3 | Not formed | | 40.3 | 19.7 | −51 |
| 4 | Formed | | 40.8 | 23.7 | −42 |
| 5 | | | 36.1 | 6.9 | −81 |
| 6 | Not formed | | 35.4 | 14.9 | −58 |
| 7 | | | 28.8 | 10.9 | −62 |
| 8 | | | 22.9 | 8.9 | −61 |
| 9 | Formed | | 23.6 | 11.1 | −53 |

As is obvious from Table 2, with respect to the ceramic capacitors of Examples 1 to 15 in which the Zn content in the second electrode layer is 4% by weight or more and within the solubility limit not forming AgZn and/or CuZn intermetallic compounds, i.e., AgZn and/or CuZn intermetallic compounds are not formed in the second electrode layer, the initial bonding strength is sufficiently high at 23.5 to 42.2 N, and the decreasing rate of bonding strength after being left at the high temperature is −12% to −20%, all of which are excellent regardless of the material and the structure of the first electrode layer and the type of solder. In each of these ceramic capacitors of Examples 1 to 15, the Zn is concentrated in the first and/or second electrode layers.

In contrast, with respect to the ceramic capacitors of Comparative Examples 1, 2, and 5 in which the second electrode layer is formed by Sn—Ag or Sn—Cu hot dipping (without containing Zn), the decreasing rate of bonding strength is significantly high at −80% to −87%.

With respect to the ceramic capacitors of Comparative Example 3 and Comparative Examples 6 to 8 in which the Zn content in the second electrode layer is less than about 4% by weight in relation to 100% by weight of the conductive constituent, the decreasing rate of bonding strength is high at −51% to −62%.

With respect to Comparative Examples 4 and 9 in which the Zn content in the second electrode layer is outside the solubility limit at which AgZn and/or CuZn intermetallic compounds are not formed, i.e., AgZn and/or CuZn intermetallic compounds are formed, the decreasing rate of bonding strength is high at −42% to −53%.

Next, in each of the ceramic capacitors of Examples 1 to 6 and Comparative Examples 1 to 3, an outer coating was applied so as to cover the ceramic body, the terminal electrodes, parts of the lead terminals and the solder sections, and coated ceramic capacitors of Examples 1 to 6 and Comparative Examples 1 to 3 were thereby produced.

The coated ceramic capacitors of Examples 1 to 6 and Comparative Examples 1 to 3 were left in an environment of 125° C. for 2,000 hours, and an AC voltage of 3 kVp-p was then applied. Heat generation (Δ° C.) at this stage was measured. The heat generation (Δ° C.) is defined as the difference in temperature between the temperature of the product and the temperature of the testing atmosphere (125° C.). The results thereof are shown in Table 3.

TABLE 3

| | Ceramic Electronic Component | |
|---|---|---|
| Sample | Heat generation (Δ° C.) | Product characteristics evaluation |
| Example | | |
| 1 | 17.5 | Excellent |
| 2 | 17.4 | Excellent |
| 3 | 17.6 | Excellent |
| 4 | 17.2 | Excellent |
| 5 | 17.3 | Excellent |
| 6 | 17.2 | Excellent |
| Comparative Example | | |
| 1 | 31.3 | Poor |
| 2 | 32.7 | Poor |
| 3 | 28.2 | Poor |

As is obvious from Table 3, the heat generation is small at 17.2 to 17.6° C. with respect to the coated ceramic capacitors of Examples 1 to 6.

In contrast, the heat generation is 28.2 to 32.7° C. with respect to the coated ceramic capacitors of Comparative Examples 1 to 3, which is higher than Examples 1 to 6 by approximately 10° C. The reason for this is that since interdiffusion between Sn and Ag is accelerated at the joint interface between the solder and the terminal electrode due to being left at the high temperature, when a high voltage is applied to such a section, abnormal heat generation occurs because electrical bonding between the ceramic body and the terminal electrodes cannot be performed. If the exposure at the high temperature is performed for a longer period of time, it is not possible to obtain the electronic component with satisfactory product characteristics since interdiffusion between Sn and Ag is further accelerated.

It will be appreciated that various changes and modifications can be made in the present invention without departing from the spirit and scope thereof. The various embodiments set forth were for the purposes of illustration only and were not intended to limit the invention.

What is claimed is:

1. A ceramic electronic component comprising:
a ceramic body;
a terminal electrode on the ceramic body; and
a lead terminal joined to the terminal electrode with solder containing Sn,
the terminal electrode comprising a first electrode layer on the ceramic body and a second electrode layer on the first electrode layer,
wherein the second electrode layer comprises a conductive constituent comprising Zn, Sn, and at least one of Ag and Cu, and the Zn content in the conductive constituent is about 4% by weight or more and is within the solubility limit not forming of AgZn and CuZn intermetallic compounds.

2. A ceramic electronic component according to claim 1, having a pair of said terminal electrode and a lead terminal joined to each of the terminal electrodes with solder containing Sn.

3. A ceramic electronic component according to claim 1, having a barrier layer comprising Zn in at least one of the first electrode layer and the second electrode layer.

4. A ceramic electronic component according to claim 3, having a barrier layer in the first electrode layer and within a range of about 2 μm from the interface with the ceramic body.

5. A ceramic electronic component according to claim 4, wherein the first electrode layer comprises a film comprising at least one of Ag and Cu.

6. A ceramic electronic component according to claim 5, wherein the lead terminal is coated with an alloy which does not contain Pb apart from incidental impurities or a metal other than Pb, and the solder does not contain Pb apart from incidental impurities.

7. A ceramic electronic component according to claim 6, wherein the second electrode layer is a hot dipped layer.

8. A ceramic electronic component according to claim 7, wherein the second electrode layer comprises Ag.

9. A ceramic electronic component according to claim 7, wherein the second electrode layer comprises Cu.

10. A ceramic electronic component according to claim 4, wherein the lead terminal is coated with an alloy which does not contain Pb apart from incidental impurities or a metal other than Pb, and the solder does not contain Pb apart from incidental impurities.

11. A ceramic electronic component according to claim 4, wherein the second electrode layer is a hot dipped layer.

12. A ceramic electronic component according to claim 4, wherein the second electrode layer comprises Ag.

13. A ceramic electronic component according to claim 4, wherein the second electrode layer comprises Cu.

14. A ceramic electronic component according to claim 1, wherein the lead terminal is coated with an alloy which does not contain Pb apart from incidental impurities or a metal other than Pb, and the solder does not contain Pb apart from incidental impurities.

15. A ceramic electronic component according to claim 1, wherein the second electrode layer is a hot dipped layer.

16. A ceramic electronic component according to claim 1, wherein the second electrode layer comprises Ag.

17. A ceramic electronic component according to claim 16, wherein the first electrode layer comprises a film comprising at least one of Ag and Cu.

18. A ceramic electronic component according to claim 1, wherein the second electrode layer comprises Cu.

19. A ceramic electronic component according to claim 18, wherein the first electrode layer comprises a film comprising at least one of Ag and Cu.

* * * * *